(12) United States Patent
Hwang et al.

(10) Patent No.: US 11,456,195 B2
(45) Date of Patent: Sep. 27, 2022

(54) WAFER PROCESSING APPARATUS AND WAFER PROCESSING METHOD USING THE SAME APPARATUS

(71) Applicant: SAMSUNG ELECTRONICS CO., LTD., Suwon-si (KR)

(72) Inventors: Youngho Hwang, Hwaseong-si (KR); Sungyong Park, Suwon-si (KR); Eunseok Seo, Seongnam-si (KR); Hyeongseok Jo, Seoul (KR); Seok Heo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 16/751,882

(22) Filed: Jan. 24, 2020

(65) Prior Publication Data

US 2021/0028034 A1  Jan. 28, 2021

(30) Foreign Application Priority Data

Jul. 23, 2019  (KR) ........................ 10-2019-0089220

(51) Int. Cl.
*H01L 21/67* (2006.01)
*G05D 16/20* (2006.01)
(Continued)

(52) U.S. Cl.
CPC ...... *H01L 21/67288* (2013.01); *C23C 14/541* (2013.01); *G05B 19/41875* (2013.01);
(Continued)

(58) Field of Classification Search
CPC ......... H01L 21/67288; H01L 21/67103; H01L 21/67248; H01L 21/6838; H01L 21/6875;
(Continued)

(56) References Cited

U.S. PATENT DOCUMENTS 7,214,548 B2  5/2007  Fayaz et al.
8,209,833 B2  7/2012  Wallmueller
(Continued)

FOREIGN PATENT DOCUMENTS

JP  2011-221006 A  11/2011
JP  4983661 B2  7/2012
(Continued)

*Primary Examiner* — Jeffrie R Lund
(74) *Attorney, Agent, or Firm* — Sughrue Mion, PLLC

(57) ABSTRACT

A wafer processing apparatus is provided. The apparatus includes: a heating plate through which vacuum ports are formed; a plurality of temperature sensors; a heating device configured to heat the heating plate; first and second power supplies; temperature controllers to generate first and second feedback temperature control signals for controlling power output power supplies based on measurement values generated by the temperature sensors; an electronic pressure regulator configured to provide vacuum pressure for fixing a wafer to the plurality of vacuum ports; and a wafer chucking controller configured to control the electronic pressure regulator, and generate a feedback pressure control signal for controlling the electronic pressure regulator based on the first and second feedback temperature control signals.

20 Claims, 17 Drawing Sheets

(51) Int. Cl.
- *H05B 1/02* (2006.01)
- *G05D 23/19* (2006.01)
- *G05B 19/418* (2006.01)
- *C23C 14/54* (2006.01)

(52) U.S. Cl.
CPC ......... *G05D 16/20* (2013.01); *G05D 23/1927* (2013.01); *H01L 21/67103* (2013.01); *H01L 21/67248* (2013.01); *H05B 1/0233* (2013.01); *G05B 2219/45031* (2013.01); *G05B 2219/50063* (2013.01)

(58) Field of Classification Search
CPC ......... H01L 21/67098; H01L 21/67011; H01L 21/67017; H01L 21/67276; H01L 21/683; C23C 14/541; G05B 19/41875; G05B 2219/45031; G05B 2219/50063; G05D 16/20; G05D 23/1927; G05D 23/1932; H05B 1/0233; Y02P 90/02
See application file for complete search history.

(56) References Cited

U.S. PATENT DOCUMENTS

| | | |
|---|---|---|
| 9,831,080 B2 | 11/2017 | Kubota et al. |
| 2004/0081439 A1* | 4/2004 | Kholodenko ..... H01L 21/67248 392/416 |
| 2006/0196653 A1* | 9/2006 | Elsdoerfer ......... G01R 31/2891 165/206 |
| 2007/0272680 A1 | 11/2007 | Tadokoro et al. |
| 2008/0097657 A1 | 4/2008 | Tinsley et al. |
| 2008/0280451 A1* | 11/2008 | Ohmoto ............ H01L 21/67109 156/345.28 |
| 2011/0233546 A1 | 9/2011 | Higashi et al. |
| 2013/0100572 A1* | 4/2013 | Shu .................... H01L 21/67288 361/234 |
| 2016/0148822 A1* | 5/2016 | Criminale ......... H01L 21/67109 165/104.34 |
| 2017/0236733 A1* | 8/2017 | Leeser ................. G05B 13/021 118/712 |
| 2017/0323813 A1* | 11/2017 | Silveira .................... C23C 16/52 |
| 2021/0028034 A1* | 1/2021 | Hwang ............... H01L 21/6838 |
| 2021/0057373 A1* | 2/2021 | Kim ........................ H01L 24/16 |
| 2021/0235548 A1* | 7/2021 | Ishikawa ................ H05B 3/283 |
| 2021/0242048 A1* | 8/2021 | Ishikawa ............ H05B 1/0233 |

FOREIGN PATENT DOCUMENTS

| | | |
|---|---|---|
| JP | 2017-175070 A | 9/2017 |
| KR | 10-0772270 B1 | 11/2007 |
| KR | 10-0842060 B1 | 6/2008 |
| KR | 4699283 B2 | 6/2011 |
| KR | 10-1116656 B1 | 3/2012 |

* cited by examiner

WAFER PROCESSING APPARATUS AND WAFER PROCESSING METHOD USING THE SAME APPARATUS

CROSS-REFERENCE TO THE RELATED APPLICATION

This application claims priority from Korean Patent Application No. 10-2019-0089220, filed on Jul. 23, 2019 in the Korean Intellectual Property Office, the disclosure of which is incorporated herein by reference in its entirety.

BACKGROUND

Methods and apparatuses consistent with embodiments of the present application relate to a wafer processing apparatus and a wafer processing method using the same.

Various processes, such as oxidation, photolithography, etching, thin-film deposition, metallization, electrical die sorting (EDS), packaging, etc., are performed on a wafer in order to manufacture semiconductor devices. As the semiconductor devices are miniaturized, high precision control of conditions of the semiconductor processes is increasingly required. In particular, in order to improve the yield rate of the semiconductor manufacturing processes, it is essential to identify warpage of a wafer in each of the processes, determine the degree of warpage, and realize uniform processing conditions to minimize the warpage of the wafer.

SUMMARY

One or more embodiments provide a wafer processing apparatus for uniformly controlling a temperature of the entire wafer and a wafer processing method using the wafer processing apparatus.

Embodiments are not limited to the objectives described above and other objectives which are not mentioned may be clearly understood by one of ordinary skill in the art from the descriptions below.

According to an aspect of an embodiment, there is provided a wafer processing apparatus including: a heating plate through which a plurality of vacuum ports is formed, and a central region and an edge region surrounding the central region are defined; a plurality of temperature sensors equipped in the heating plate; a heating device configured to heat the heating plate; a first power supply and a second power supply configured to provide operational power to different portions of the heating device; a first temperature controller configured to generate a first feedback temperature control signal for controlling power output of the first power supply based on a first measurement value generated by the plurality of temperature sensors; a second temperature controller configured to generate a second feedback temperature control signal for controlling power output of the second power supply based on a second measurement value generated by the plurality of temperature sensors; an electronic pressure regulator configured to provide vacuum pressure for fixing a wafer disposed on the heating plate to the plurality of vacuum ports and regulate pressure of the plurality of vacuum ports; and a wafer chucking controller configured to control the electronic pressure regulator, and generate a feedback pressure control signal for controlling the pressure of the electronic pressure regulator based on the first feedback temperature control signal and the second feedback temperature control signal.

According to an aspect of an embodiment, there is provided a wafer processing apparatus including: a heating plate through which a plurality of vacuum ports is formed, and a central region, an edge region surrounding the central region, and a middle region between the central region and the edge region are defined; a plurality of temperature sensors configured to measure a temperature of the heating plate; a heating device configured to heat the heating plate; a first power supply, a second power supply and a third power supply configured to provide operational power to the heating device; a first temperature controller configured to generate a first feedback temperature control signal for controlling a first power output of the first power supply based on a first measurement value of the plurality of temperature sensors; a second temperature controller configured to generate a second feedback temperature control signal for controlling a second power output of the second power supply based on a second measurement value of the plurality of temperature sensors; a third temperature controller configured to generate a third feedback temperature control signal for controlling a third power output of the third power supply based on a third measurement value of the plurality of temperature sensors; an electronic pressure regulator configured to regulate pressure of the plurality of vacuum ports; and a wafer chucking controller configured to control the electronic pressure regulator. The plurality of vacuum ports includes: a plurality of first vacuum ports arranged in circular symmetry with respect to the center of the heating plate; and a plurality of second vacuum ports arranged in circular symmetry with respect to the center of the heating plate and farther from the central region of the heating plate than the plurality of first vacuum ports. The electronic pressure regulator includes: a first electronic pressure regulator configured to regulate pressure of the plurality of first vacuum ports; and a second electronic pressure regulator configured to regulate pressure of the plurality of second vacuum ports. The wafer chucking controller is further configured to generate a first feedback pressure control signal and a second feedback pressure control signal configured to control, respectively, pressure of the first electronic pressure regulator and the second electronic pressure regulator based on the first feedback temperature control signal, the second feedback temperature control signal and the third feedback temperature control signal.

According to an aspect of an embodiment, there is provided a wafer processing apparatus including: a heating plate through which a plurality of vacuum ports is formed, and a central region and an edge region surrounding the central region are defined; a plurality of temperature sensors configured to measure a temperature of the heating plate; a heating device configured to heat the heating plate; a first power supply and a second power supply configured to provide operational power to the heating device; a first measuring device and a second measuring device configured to measure a first power output of the first power supply and a second power output of the second power supply, respectively; a first temperature controller and a second temperature controller configured to generate a first feedback temperature control signal and a second feedback temperature control signal configured to control the first power output and the second power output based on measurement values of the plurality of temperature sensors; an electronic pressure regulator configured to regulate pressure of the plurality of vacuum ports; and a wafer chucking controller configured to control pressure of the electronic pressure regulator, and generate a feedback pressure control signal for controlling the pressure of the electronic pressure regulator based on the first power output and the second power output.

According to an aspect of an embodiment, there is provided a wafer processing method including: heating a heating plate, wherein a plurality of vacuum ports are formed through the heating plate and vacuum pressure is applied to the plurality of vacuum ports; loading a wafer on the heating plate; controlling a heating device to heat the heating plate to a pre-set temperature and substantially maintain the heating plate at the pre-set temperature in correspondence to a temperature change of the heating plate due to the wafer being loaded on the heating plate; identifying warpage of the wafer based on power outputs of the heating device; and regulating the vacuum pressure in the plurality of vacuum ports based on the warpage of the wafer.

BRIEF DESCRIPTION OF THE DRAWINGS

The above and other aspects, features and advantages will be more clearly understood from the following detailed description taken in conjunction with the accompanying drawings in which.

DETAILED DESCRIPTION

Figure 1A:
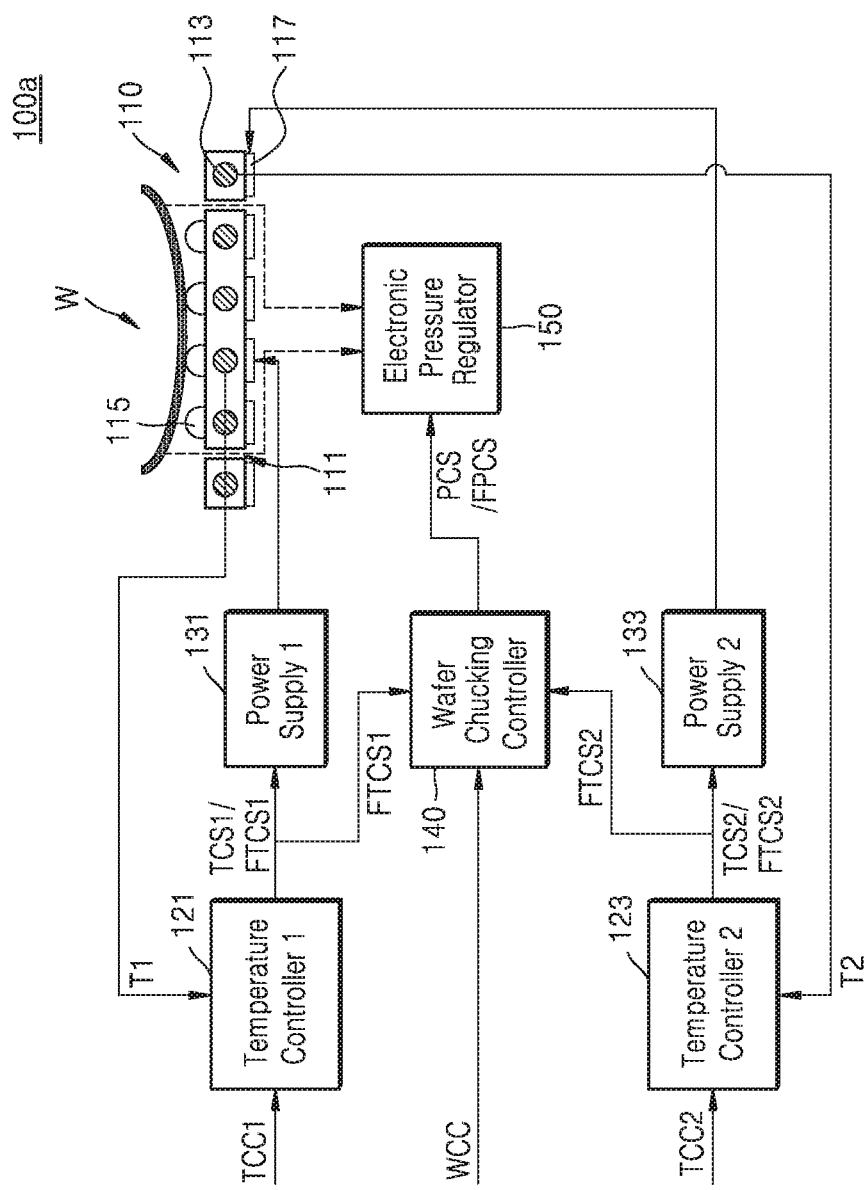
FIGS. 1A, 1B and 1C are a diagrams for describing a wafer processing apparatus according to embodiments.

Hereinafter, embodiments will be described in detail by referring to the accompanying drawings. Like reference numerals will be used for like reference components in the drawings, and repeated descriptions will not be given. In the drawings hereinafter, a thickness or a size of each of layers is exaggerated for convenience and clarity of description, and thus, actual shapes and ratios of the components may be slightly different from the drawings. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1A is a diagram for describing a wafer processing apparatus 100a according to embodiments.

Referring to FIG. 1A, the wafer processing apparatus 100a may include a heating plate 110, a first temperature controller 121 and a second temperature controller 123, a first power supply 131 and a second power supply 133, a wafer chucking controller 140, and an electronic pressure regulator 150. For example, the electronic pressure regulator 150 may include an electronic air flow regulator.

A wafer W may be arranged on the heating plate 110. According to one or more embodiments, the heating plate 110 may heat the wafer W to a pre-set temperature. According to one or more embodiments, the heating plate 110 may support and fix the wafer W and maintain the temperature of the wafer W at a pre-set temperature, while various semiconductor device manufacturing processes are performed on the wafer W.

The processes to be performed on the wafer W while the wafer W is loaded in the wafer processing apparatus 100a and supported by the heating plate 110, may include i) a thermal oxidation process for forming an oxide layer, ii) a lithography process including spin coating, exposure, and development, iii) a thin-film deposition process, and iv) a dry or a wet etching process. That is, the heating plate 110 may be a chucking device to support the wafer W and maintain the temperature of the wafer W during semiconductor device manufacturing processes, where the temperature of the wafer W has to be maintained at a pre-set temperature.

The thin-film deposition process to be performed on the wafer W may be, for example, any one of atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and DC magnetron sputtering.

The dry etching process to be performed on the wafer W may be, for example, any one of reactive ion etching (RIE), deep RIE (DRIE), ion beam etching (IBE), and Ar milling. As another example, the dry etching process to be performed on the wafer W may be atomic layer etching (ALE). Also, the wet etching process to be performed on the wafer W may be an etching process using, as etchant gas, at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS.

In some embodiments, a planarization process, such as a chemical mechanical polish (CMP) process, an ion injection process, a photolithography process, etc. may also be performed on the wafer W.

The wafer W may include, for example, silicon (Si). The wafer W may include a semiconductor element, such as germanium (Ge), or a compound semiconductor, such as silicon carbide (SiC), gallium arsenide (GaAs), indium arsenide (InAs), and indium phosphide (InP). In some embodiments, the wafer W may have a silicon on insulator (SOI) structure. The wafer W may include a buried oxide layer. In some embodiments, the wafer W may include a conductive area, for example, wells doped with impurities. In some embodiments, the wafer W may have various device isolation structures, such as shallow trench isolation (STI), which isolate the above doped wells from each other. The wafer W may have a first surface, which is an active surface, and a second surface, which is opposite to the first surface and is a non-active surface. The wafer W may be arranged on the heating plate 110 such that the second surface of the wafer W faces the heating plate 110.

Referring to FIG. 1A, it is illustrated that the wafer W is convex in a downward direction, that is, in a direction facing the heating plate 110. However, embodiments are not limited thereto. The wafer W may have an upwardly convex shape or may have a saddle shape.

A plurality of support pins 115 may be arranged on a top surface of the heating plate 110. The plurality of support pins 115 may support the wafer W arranged on the heating plate 110. The plurality of support pins 115 may prevent the wafer W from directly contacting the heating plate 110, thereby preventing the wafer W from being contaminated by the heating plate 110.

In some embodiments, a heating device 117 having a patterned thin-plate shape may be arranged under the heating plate 110. However, embodiments are not limited thereto and the heating device 117 may be provided in the heating plate 110 or above the heating plate 110. The heating device 117 may be, for example, an electrothermal device and may have various predetermined shapes to provide uniform heat to the wafer W loaded on the heating plate 110.

In some embodiments, the heating device 117 may be divided into a plurality of areas so as to correspond to a plurality of regions of the heating plate 110. An example division structure of the heating device 117 is indicated by broken lines in FIGS. 2A, 2B and 2C. Accordingly, the heating device 117 may provide different heat outputs onto different portions of the heating plate 110. Even when a region of the heating plate 110 has a higher or a lower temperature than other regions of the heating plate 110, the heating device 117 may control the heat output such that the entire surface of the heating plate 110 has uniform temperature distribution.

A plurality of vacuum ports 111, to which vacuum pressure is provided from the outside, may be formed on the heating plate 110. The plurality of vacuum ports 111 may penetrate the heating plate 110 and may function as a path through which vacuum pressure is provided. FIG. 1A indicates the vacuum pressure by using dashed arrows. In some embodiments, the vacuum ports 111 may be arranged on the heating plate 110 in various shapes. Example shapes of the vacuum ports 111 will be described below with reference to FIGS. 2A, 2B and 2C. The vacuum ports 111 may pull the wafer W via the vacuum pressure such that the wafer W is fixed on the plurality of support pins 115.

Temperature sensors 113 may be provided in the heating plate 110. However, embodiments are not limited thereto, and the temperature sensors 113 may be arranged on the top surface or the bottom surface of the heating plate 110. The temperature sensors 113 may detect the temperature of the heating plate 110. The temperature sensors 113 may be arranged on a central region CR (see FIG. 2A), an edge region ER (see FIG. 2A), and a middle region MR (see FIG. 2A) between the central region CR and the edge region ER, in a particular arrangement First and second temperature controllers 121 and 123 may generate first and second temperature control signals TCS1 and TCS2 for controlling power outputs of first and second power supplies 131 and 133 by receiving first and second temperature control commands TCC1 and TCC2 according to a process recipe. Here, the first temperature control signal TCS1 may be a signal for controlling an output of a portion of the heating device 117, the portion corresponding to the central region CR (see FIG. 2A) and the second temperature control signal TCS2 may be a signal for controlling an output of a portion of the heating device 117, the portion corresponding to the edge region ER (see FIG. 2A).

The first and second temperature controllers 121 and 123 may receive first and second temperatures T1 and T2, which are temperature measurement values, from the temperature sensors 113. The first temperature T1 may be a temperature measured by the temperature sensors 113 arranged at the central region CR (see FIG. 2A) of the heating plate 110 and the second temperature T2 may be a temperature measured by the temperature sensors 113 corresponding to the edge region ER (see FIG. 2A) of the heating plate 110.

The first and second temperature controllers 121 and 123 may generate first and second feedback temperature control signals FTCS1 and FTCS2 based on the first and second temperatures T1 and T2. The first feedback temperature control signal FTCS1 may be a signal corresponding to the central region CR (see FIG. 2A) of the heating plate 110 and the second feedback temperature control signal FTCS2 may be a signal corresponding to the edge region ER (see FIG. 2A) of the heating plate 110.

The first and second feedback temperature control signals FTCS1 and FTCS2 may be feedback signals based on the first and second temperatures T1 and T2. For example, when the first temperature T1 is lower than a temperature according to a process recipe, the first temperature controller 121 may generate the first feedback temperature control signal FTCS1 to increase the power output of the first power supply 131. On the contrary, when the second temperature T2 is higher than the temperature according to the process recipe, the second temperature controller 123 may generate the second feedback temperature control signal FTCS2 to decrease the power output of the second power supply 133.

The first and second power supplies 131 and 133 may generate power outputs according to the first and second temperature control signals TCS1 and TCS2 or the first and second feedback temperature control signals FTCS1 and FTCS2 and may provide the power outputs to the heating device 117. The first power supply 131 may transmit the power output to the heating device 117 corresponding to the central region CR (see FIG. 2A) of the heating plate 110. The second power supply 133 may transmit the power output to the heating device 117 corresponding to the edge region ER (see FIG. 2A) of the heating plate 110.

The wafer chucking controller 140 may control the electronic pressure regulator 150. The wafer chucking controller 140 may generate a pressure control signal PCS for controlling the electronic pressure regulator 150 based on an external wafer chucking command WCC.

The wafer chucking controller 140 may generate a feedback pressure control signal FPCS, which is a signal for controlling the electronic pressure regulator 150, based on the first and second feedback temperature control signals FCS1 and FCS2. The wafer chucking controller 140 may perform a certain calculation based on the first and second feedback temperature control signals FTCS1 and FTCS2 of the first and second temperature controllers 121 and 123. The wafer chucking controller 140 may determine a degree of warpage of the wafer W via the above calculation. According to one or more embodiments, the wafer chucking controller 140 may generate the feedback pressure control signal FPCS based on the determined warpage of the wafer W. According to other embodiments, the wafer chucking controller 140 may generate the feedback pressure control signal FPCS based on a result of the above calculation without determining warpage of the wafer W. The calculation of the wafer chucking controller 140 will be described again below.

In some embodiments, the electronic pressure regulator 150 may regulate an intensity of the vacuum pressure of the vacuum ports 111, based on the pressure control signal PCS or the feedback pressure control signal FPCS. In some embodiments, the electronic pressure regulator 150 may include a servo valve or a solenoid valve. According to other embodiments, the electronic pressure regulator 150 may include an electronic vacuum pressure transducer. The electronic pressure regulator 150 may further include an internal pressure sensor for monitoring a pressure output.

When wafer processing apparatuses according to the related art fix the wafer W by using the vacuum pressure method, the wafer processing apparatuses may fix the wafer W by applying maximum pressure, regardless of the degree of warpage of the wafer W, by using a vacuum valve controlled in an on and off method. The fixing of the wafer W by using the vacuum pressure method generates turbulent air and causes non-uniform heat loss of an edge of the wafer W, thereby deteriorating uniform thermal distribution on the entire surface of the wafer W.

According to one or more embodiments, whether or not the wafer W has warpage and a degree of the warpage may be determined based on the first and second feedback temperature control signals FTCS1 and FTCS2, and the wafer pressure control signal FPCS may be generated based on the determined degree of the warpage of the wafer W, and thus, the wafer W may be fixed by using optimum vacuum pressure. Here, the optimum vacuum pressure may be any one of minimum pressure for fixing the wafer W and minimum pressure for reducing warpage of the wafer W and uniformly processing the wafer W. Accordingly, an excessive vacuum pressure that is beyond necessity may not be applied to the wafer W and turbulent air between the wafer W and the heating plate 110 may be minimized. Accordingly, the reliability with respect to uniform processing of the wafer W may be improved.

The first and second temperature controllers 121 and 123 and the wafer chucking controller 140 may include hardware, firmware, software, or combinations thereof.

For example, the first and second temperature controllers 121 and 123 and the wafer chucking controller 140 may include computing devices, such as a workstation computer, a desktop computer, a laptop computer, a tablet computer, etc. The first and second temperature controllers 121 and 123 and the wafer chucking controller 140 may include a simple controller, such as a hardware controller, a microprocessor, a complex processor, such as a central processing unit (CPU), a graphics processing unit (GPU), etc., a processor including software, exclusive-use hardware, or firmware. The first and second temperature controllers 121 and 123 and the wafer chucking controller 140 may include a general-purpose computer, or application specific hardware, such as a digital signal processor (DSP), a field programmable gate array (FPGA), an application specific integrated circuit (ASIC), etc.

In some embodiments, operations of the first and second temperature controllers 121 and 123 and the wafer chucking controller 140 may be realized by using commands which may be read and executed by one or more processors, and stored on a computer-readable recording medium. Here, the computer-readable recording medium may include certain mechanisms for storing and/or transmitting information in a machine (for example, a computing device)-readable form. For example, the computer-readable recording medium may include read only memory (ROM), random-access memory (RAM), magnetic disk storage media, optical storage media, flash memory devices, electrical, optical, acoustic, or other radio wave signals (for example, a carrier wave, an infrared signal, a digital signal, etc.), and other random signals.

Firmware, software, routines, or instructions may be configured to perform the operations described with respect to the first and second temperature controllers 121 and 123 and the wafer chucking controller 140 or other processes to be described hereinafter. For example, the first and second temperature controllers 121 and 123 and the wafer chucking controller 140 may be realized by using software for generating a signal, receiving data for feedback, performing certain calculations and regulating processes, with respect to processing the wafer W.

However, this is for convenience of explanation. The operations of the first and second temperature controllers 121 and 123 and the wafer chucking controller 140 may be performed by using computing devices, processors, controllers, or other devices executing firmware, software, routine, instructions, etc.

Figure 1B:
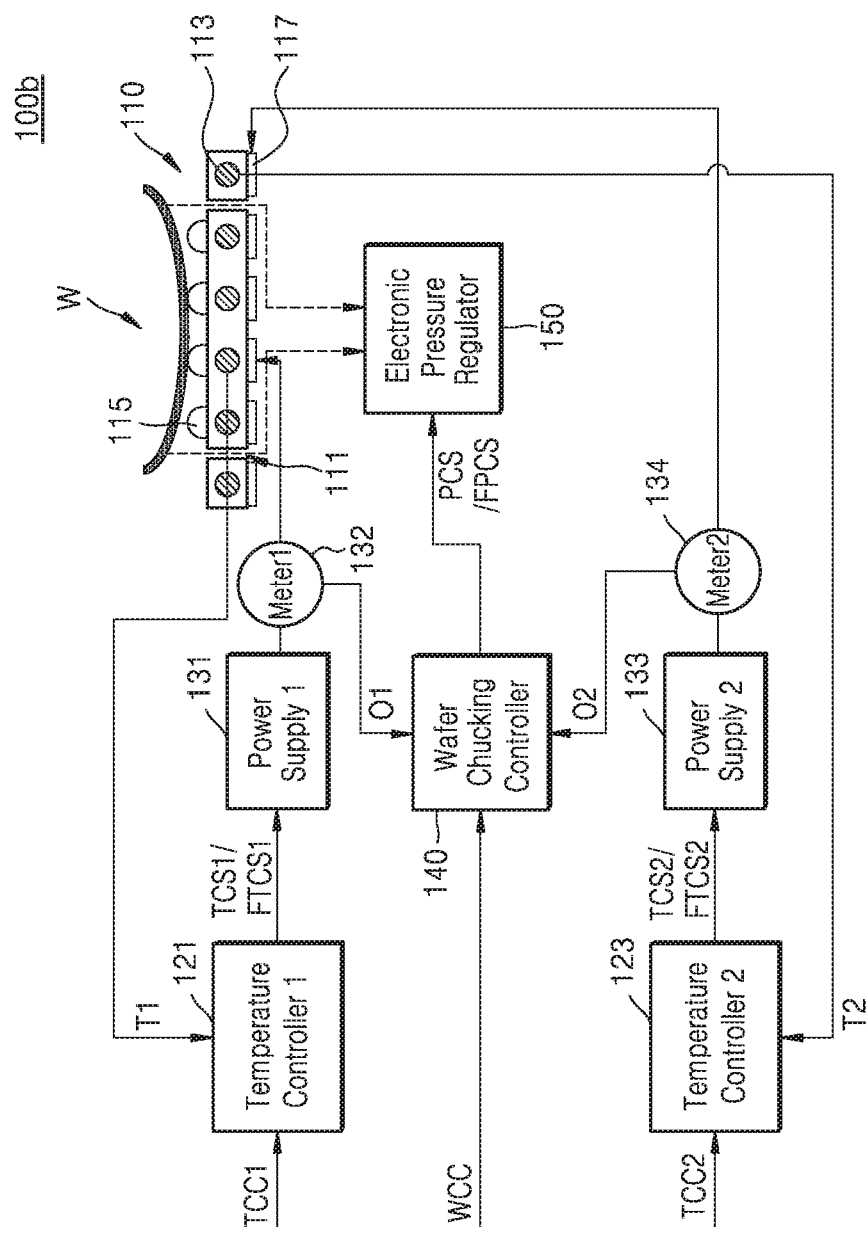

FIG. 1B is a diagram for describing a wafer processing apparatus 100b according to other embodiments.

For convenience of description, aspects that are the same as the aspects described with reference to FIG. 1A will not be repeated.

Referring to FIG. 1B, the wafer processing apparatus 100b may further include a first measuring device 132 (i.e., a meter) and a second measuring device 134, in addition to the components of the wafer processing apparatus 100a illustrated in FIG. 1A.

The first measuring device 132 may be arranged between the first power supply 131 and the heating plate 110. The first measuring device 132 may be connected to a path through which a power output of the first power supply 131 is provided to the heating plate 110. The second measuring device 134 may be arranged between the second power supply 133 and the heating plate 110. The second measuring device 134 may be connected to a path through which a power output of the second power supply 133 is provided to the heating plate 110.

The first and second measuring devices 132 and 134 may be any one of a voltmeter, an ammeter, and a wattmeter. In some embodiments, the first measuring device 132 may measure a first power output O1, which is the power output of the first power supply 131. The first power output O1 may be a power output delivered to the heating device 117 corresponding to the central region CR (see FIG. 2A) of the heating plate 110, and may be any one of voltage, current, or electricity. In some embodiments, the second measuring device 134 may measure a second power output O2, which is the power output of the second power supply 133. The second power output O2 may be a power output delivered to the heating device 117 corresponding to the edge region ER (see FIG. 2A) of the heating plate 110, and may be any one of voltage, current, and electricity.

The wafer chucking controller 140 may generate a feedback pressure control signal FPCS based on the first and second power outputs O1 and O2. In more detail, the wafer chucking controller 140 may perform a certain calculation based on the first and second power outputs O1 and O2 and then, based on a result of the calculation, may generate the feedback pressure control signal FPCS for controlling the electronic pressure regulator 150.

Figure 1C:
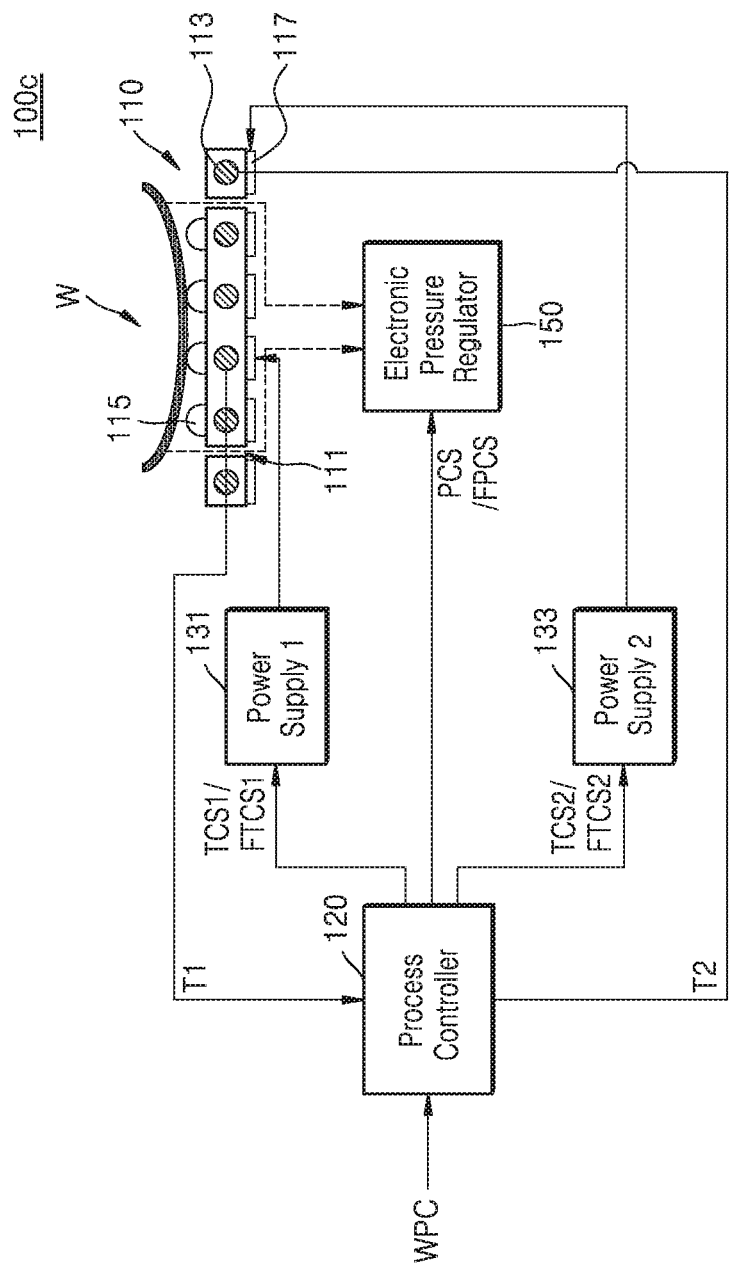

FIG. 1C is as diagram for describing a wafer processing apparatus 100c according to other embodiments.

For convenience of description, aspects that are the same as the aspects described with reference to FIG. 1A will not be repeated.

Referring to FIG. 1C, unlike the wafer processing apparatus 100a illustrated in FIG. 1A, the wafer processing apparatus 100c may include a process controller 120 configured to control a temperature of the heating plate 110 and control an output pressure of the electronic pressure regulator 150. In some embodiments, the process controller 120 may perform the functions of the first and second temperature controllers 121 and 123 and the wafer chucking controller 140 of FIG. 1A.

The process controller 120 may include various types of computing devices or processor devices, as described above in FIG. 1A with respect to the first and second temperature controllers 121 and 123 and the wafer chucking controller 140. The process controller 120 may include software and/or firmware for controlling the temperature of the heating plate 110 and controlling the pressure output of the electronic pressure regulator 150.

In some embodiments, the process controller 120 may generate first and second temperature control signals TCS1 and TCS2 and a pressure control signal PCS by receiving a wafer process command WPC according to a process recipe.

In some embodiments, the process controller 120 may receive signals with respect to first and second temperatures T1 and T2 from the temperature sensors 113, generate first and second feedback temperature control signals FTCS1 and FTCS2 for controlling the temperature of the heating plate 110 by using the signals with respect to the first and second temperatures T1 and T2, and transmit the first and second feedback temperature control signals FTCS1 and FTCS2 to the first and second power supplies 131 and 133, respectively.

In some embodiments, the process controller 120 may generate a feedback pressure control signal FPCS for controlling the electronic pressure regulator 150, based on the first and second feedback temperature control signals FTCS1 and FTCS2.

Figure 2A:
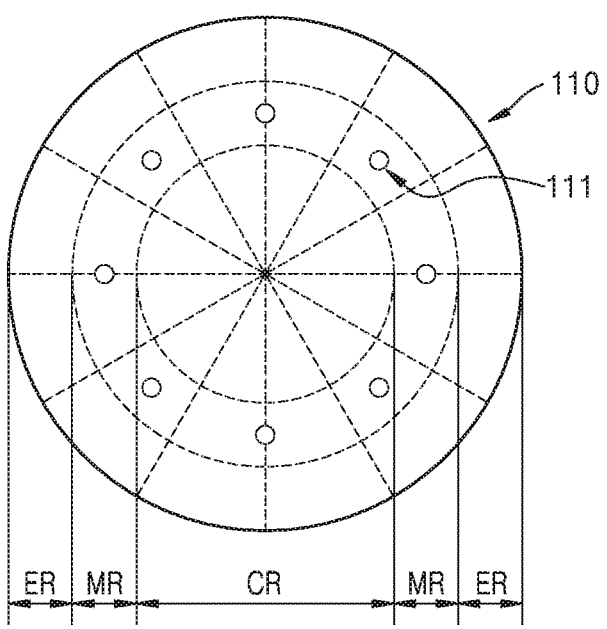
FIGS. 2A, 2B and 2C are plan views for describing a heating plate according to embodiments.
Figure 2B:
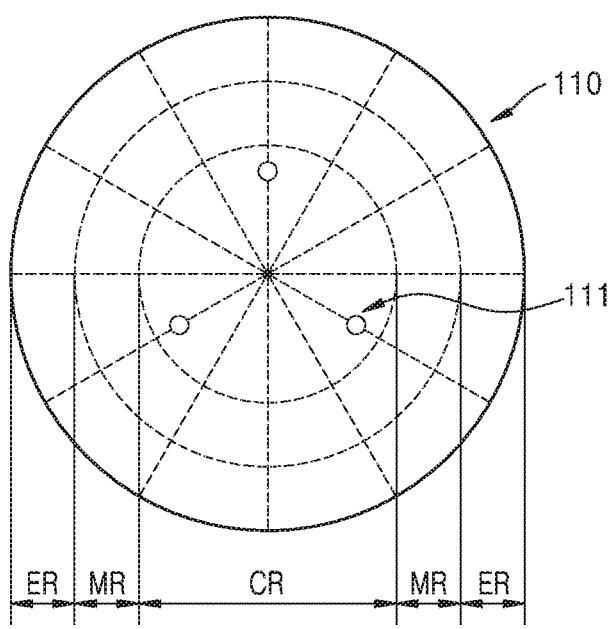
Figure 2C:
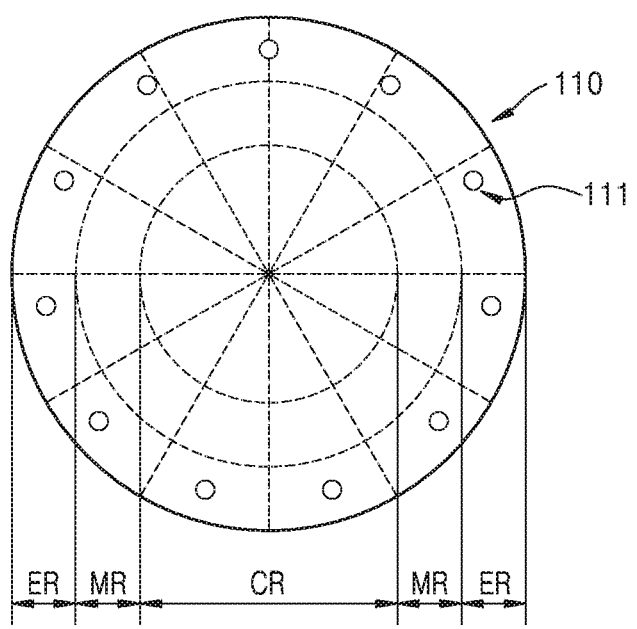

FIGS. 2A, 2B and 2C are plan views for describing the heating plate 110 according to embodiments.

Referring to FIGS. 2A, 2B and 2C, a central region CR, an edge region ER, and a middle region MR between the central region CR and the edge region ER may be defined on the heating plate 110.

In some embodiments, as illustrated in FIGS. 2A, 2B and 2C, the vacuum ports 111 may be arranged in circular symmetry with respect to the center of the heating plate 110. Based on this arrangement of the vacuum ports 111, the wafer W (see FIG. 1A) loaded on the heating plate 110 may be fixed via uniform pressure.

In the example of FIG. 2A, the vacuum ports 111 may be arranged at the middle region MR of the heating plate 110. In the example of FIG. 2B, the vacuum ports 111 may be arranged at the central region CR of the heating plate 110. In the example of FIG. 2C, the vacuum ports 111 may be arranged at the edge region ER of the heating plate 110.

Figure 3:
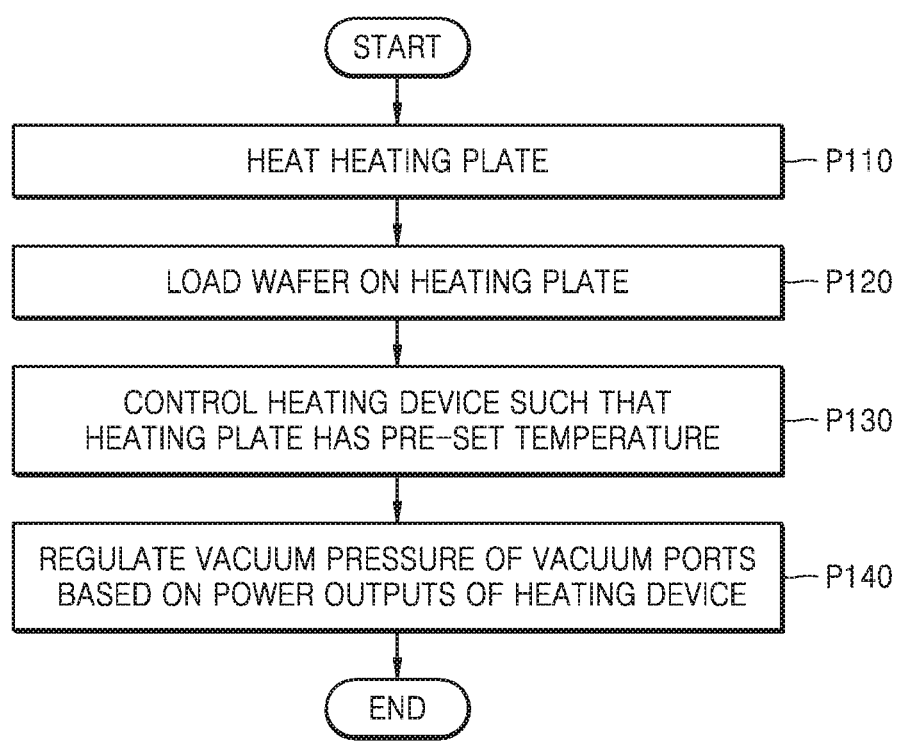
FIG. 3 is a flowchart of a wafer processing method according to embodiments.

FIG. 3 is a flowchart of a wafer processing method according to embodiments.

Referring to FIGS. 1A and 3, the heating plate 110 may be heated in operation P110.

As described above, the first and second temperature controllers 121 and 123 may generate the first and second temperature control signals TCS1 and TCS2, respectively, based on the first and second temperature control commands TCC1 and TCC2, respectively, according to the process recipe.

The first and second power supplies 131 and 133 may heat the heating plate 110 to have a uniform temperature on the entire surface of the heating plate 110, based on the received first and second temperature control signals TSC1 and TSC2.

Figure 4:
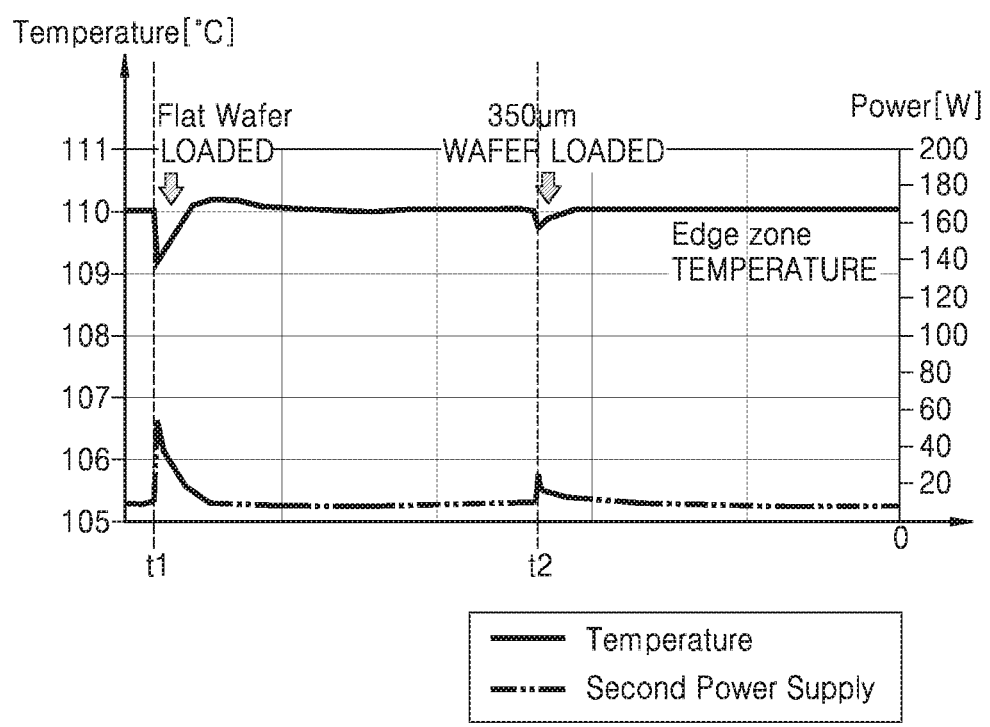
FIG. 4 is a graph showing a result of an experimental example for describing a wafer processing method according to embodiments.

FIG. 4 is a graph showing a result of an experimental example for describing a wafer processing method according to embodiments. In more detail, FIG. 4 indicates a temperature of the edge region ER (see FIG. 2A) of the heating plate 110 and a power output of the second power supply 133 with respect to the processing of the wafer W, according to time.

In the graph of FIG. 4, the vertical axis indicates the temperature of the heating plate 110 or the power output of the second power supply 133 and the horizontal axis indicates time. Also, in the graph of FIG. 4, the solid line indicates the temperature of the edge region ER (see FIG. 2A) of the heating plate 110, and broken lines indicate the second power supply 133 output.

Referring to FIGS. 1A, 2A, 3, and 4, in operation P120, the wafer W may be loaded on the heating plate 110. The loading of the wafer W may be performed by a transporting robot, and the loaded wafer may be fixed via vacuum pressure of the vacuum ports 111.

In the experimental example of FIG. 4, a wafer that is substantially flat (that is, without warpage) is loaded at a first time point t1 and a wafer having warpage is loaded at a second time point t2.

When the wafer W loaded at the second time point t2 is loaded such that a non-active surface thereof faces the heating plate 110, a distance between the edge region ER of the heating plate 110 and the wafer W is greater than a distance between the central region CR of the heating plate 110 and the wafer W. The wafer W of the experimental example may have warpage of about 350 μm. Here, the warpage of about 350 μm indicates that a height difference between a highest point and a lowest point with respect to a top surface of the wafer W is about 350 μm.

Generally, the temperature of the wafer W directly before the wafer W is loaded on the heating plate 110 is lower than the temperature of the heating plate 110 according to a process recipe, and thus, the temperature of the edge region ER of the heating plate 110 may decrease directly after the wafer W is loaded.

Compared with the first time point t1 at which the flat wafer is loaded, the second time point t2 shows a relatively less temperature drop of the edge region ER of the heating plate 110 directly after the wafer W is loaded. Accordingly, the power output of the second power supply 133 at the second time point t2 is less than the power output of the first power supply 131 at the first time point t1.

Table 1 below shows temperatures of the heating device 117 corresponding to the central region CR, the middle region MR, and the edge region ER of the heating plate 110 right after the flat wafer is loaded, the temperatures of the central region CR, the middle region MR, and the edge region ER of the heating plate 110 right after the wafer having warpage is loaded, and also a ratio of the corresponding temperatures.

TABLE 1

|  | Flat wafer (A) | Wafer having warpage (B) | Ratio (B/A) |
| --- | --- | --- | --- |
| Lowest average temperature | 108.9° C. | 109.5° C. | 100.6% |
| Lowest temperature of central region | 108.2° C. | 108.9° C. | 100.6% |
| Lowest temperature of middle region | 108.3° C. | 109.3° C. | 100.9% |
| Lowest temperature of edge region | 108.2° C. | 109.7° C. | 100.5% |

As described above, the plurality of temperature sensors are arranged at predetermined locations on the entire surface of the heating plate 110 and Table 1 shows minimum values of the measurement values of the temperature sensors arranged in the central region CR, the middle region MR, and the edge region ER.

The ratio between the changed temperatures right after the flat wafer W and the wafer W having warpage are loaded is about 100.5% to about 100.9%, which indicates a rather low identifying characteristic.

Next, referring to FIGS. 1A and 3, in operation P130, the heating device 117 may be controlled such that the heating plate 110 has a pre-set temperature.

Operation P130 may be performed substantially simultaneously with the loading of the wafer W in operation P120, or right after the loading of the wafer W in operation P120.

As described above, the controlling of the heating device 117 may include: measuring the temperature of the heating plate 110 for each region, the temperature including the first and second temperatures T1 and T2; generating the first and second feedback temperature control signals FTCS1 and FTCS2 based on the temperature for each region; and providing power outputs to portions of the heating device 117, the portions corresponding to the different regions of the heating plate 110, based on the first and second feedback temperature control signals FTCS1 and FTCS2.

Next, referring to FIGS. 1A and 3, vacuum pressure for chucking the wafer W may be regulated based on the power outputs of the heating device 117, in operation P140.

Table 2 below shows the power outputs of the heating device 117 corresponding to the central region CR, the middle region MR, and the edge region ER of the heating plate 110, right after the first time point t1 and the second time point t2 at which the flat wafer W and the wafer W having warpage are loaded respectively.

TABLE 2

| | Flat wafer (A) | Wafer having warpage (B) | Ratio (B/A) |
|---|---|---|---|
| Highest power output of central region | 84.9 W | 94.9 W | 111.8% |
| Highest power output of middle region | 109.9 W | 49.6 W | 45.1% |
| Highest power output of edge region | 55.1 W | 25.7 W | 46.6% |
| Difference in power outputs between central region and edge region | 29.8 W | 69.2 W | 232.2% |

Compared to Table 1 in which temperature differences between the wafer W having no warpage and the wafer W having warpage for the central region CR, the middle region MR, and the edge region ER of the heating plate 110, right after the wafers W are loaded, are less, it is identified in Table 2 that a difference between power outputs of the heating device 117 corresponding to the central region CR and the edge region ER is large, for the wafer B having warpage and the wafer A that is flat.

For convenience of description, the difference between the power output of the heating device 117 (or the power supply) corresponding to the central region CR and the power output of the heating device 117 (or the power supply) corresponding to the edge region ER will be referred to as a center-edge power output difference.

In some embodiments, the wafer chucking controller 140 may calculate the center-edge power output difference. Furthermore, in some embodiments, the wafer chucking controller 140 may calculate a ratio between the center-edge power output difference of the wafer B having warpage and the center-edge power output difference of the wafer A having no warpage. As shown in Table 2, the ratio between the center-edge power output difference of the wafer B having warpage of about 350 μm and the center-edge power output difference of the wafer A that is flat may be about 232.2%, which indicates a high identifying characteristic with respect to whether or not warpage occurs and the degree of the warpage.

In FIG. 2, a maximum power output of the power outputs of the heating device 117 corresponding to the central region CR is compared with a maximum power output of the power outputs of the heating device 117 corresponding to the edge region ER. However, embodiments are not limited thereto. In other embodiments, the wafer chucking controller 140 may calculate the center-edge power output difference by comparing a minimum power output of the power outputs of the heating device 117 corresponding to the central region CR to a minimum power output of the power outputs of the heating device 117 corresponding to the edge region ER.

Also, as will be described below, the wafer chucking controller 140 may determine whether or not warpage occurs to the wafer and the degree of warpage. In some embodiments, when the wafer chucking controller 140 determines that the wafer W has warpage having a downwardly convex shape, the wafer chucking controller 140 may calculate the center-edge power output difference by comparing a maximum power output of the power outputs of the heating device 117 corresponding to the central region CR with a minimum power output of the power outputs of the heating device 117 corresponding to the edge region ER.

In other embodiments, when the wafer chucking controller 140 determines that the wafer W has warpage having an upwardly convex shape, the wafer chucking controller 140 may calculate the center-edge power output difference by comparing a minimum power output of the power outputs of the heating device 117 corresponding to the central region CR with a maximum power output of the power outputs of the heating device 117 corresponding to the edge region ER.

In other embodiments, the wafer chucking controller 140 may calculate the center-edge power output difference by comparing an average power output of the power outputs of the heating device 117 corresponding to the central region CR with an average power output of the power outputs of the heating device 117 corresponding to the edge region ER. In other embodiments, the wafer chucking controller 140 may calculate the center-edge power output difference by comparing a median power output of the power outputs of the heating device 117 corresponding to the central region CR with a median power output of the power outputs of the heating device 117 corresponding to the edge region ER.

According to example embodiments, the wafer chucking controller 140 may determine whether or not warpage occurs to the wafer W based on the first and second feedback temperature control signals without an assistance of an additional height measuring sensor. In some embodiments, the wafer chucking controller 140 may determine whether or not warpage occurs to the wafer W and the degree of warpage by using a look-up function about data about a center-edge power output difference of a wafer W currently in process, or by comparison, etc., between previous online/offline data. In other embodiments, the wafer chucking controller 140 may determine whether or not warpage occurs to the wafer W and the degree of warpage by using a look-up function about data about a ratio between a center-edge power output difference of the flat wafer W and a center-edge power output difference of the wafer W currently in process, or by comparison, etc., between previous online/offline data.

The wafer chucking controller 140 may generate the feedback pressure control signal FPCS based on the warpage of the wafer W. For example, according to the feedback pressure control signal FPCS, when the wafer W has a large warpage, the electronic pressure regulator 150 may be configured to output a greater vacuum pressure, and when the wafer W has small warpage, the electronic pressure regulator 150 may be configured to output a less vacuum pressure.

In other embodiments, the wafer chucking controller 140 may generate the feedback pressure control signal FPCS based on the first and second feedback temperature control signals FTCS1 and FTCS2. In more detail, the wafer chucking controller 140 may generate the feedback pressure control signal FPCS by using a look-up function about data about an optimum pressure control signal based on a center-edge power output difference of the wafer W currently in process, or by comparison, etc., between previous online/offline data.

Above, the wafer processing method performed by the wafer processing apparatus 100a of FIG. 1A is described. However, it will be understood by one of ordinary skill in the art that the wafer processing apparatuses 100b and 100c of FIGS. 1B and 1C may process the wafer by using substantially the same method.

Figure 5:
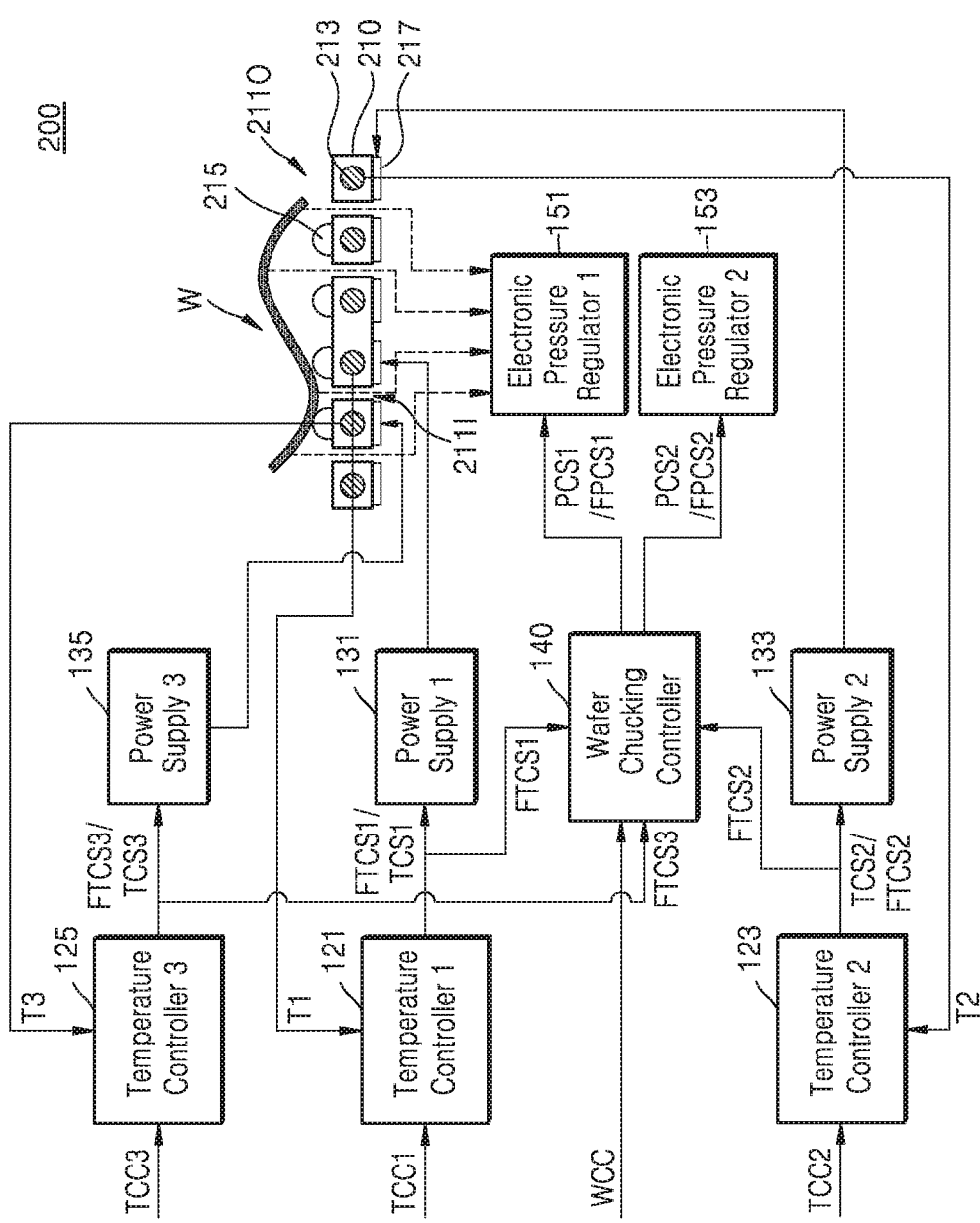
FIG. 5 is a diagram for describing a wafer processing apparatus according to other embodiments.

FIG. 5 is a diagram for describing a wafer processing apparatus 200 according to other embodiments.

Figure 6:
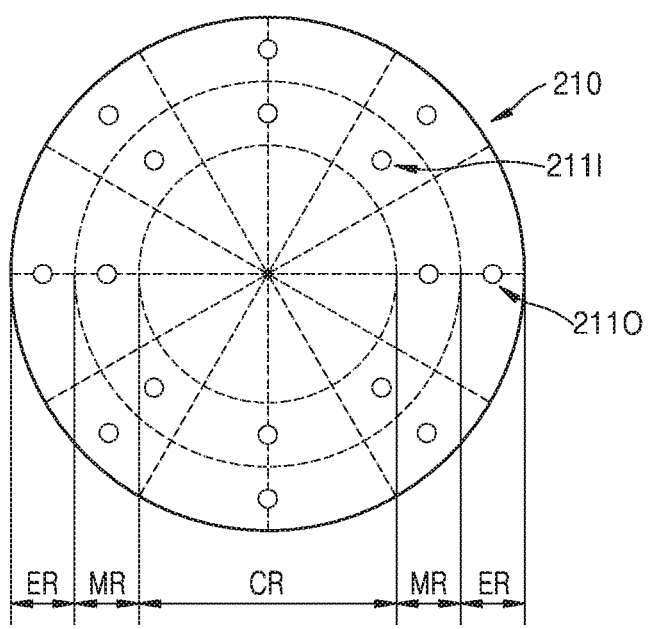
FIG. 6 is a top view schematically illustrating a heating plate included in a wafer processing apparatus according to example embodiments.

FIG. 6 is a schematic top view of a heating plate 210 included in the wafer processing apparatus 200, according to example embodiments.

For convenience of description, aspects that are the same as the aspects described with reference to FIG. 1A will not be repeated.

Referring to FIGS. 5 and 6, the wafer processing apparatus 200 may include the heating plate 210, first through third temperature controllers 121, 123, and 125, first through third power supplies 131, 133, and 135, the wafer chucking controller 140, and first and second electronic pressure regulators 151 and 153.

Temperature sensors 213, support pins 215, and a heating device 217 may be substantially the same as the temperature sensors 113, the support pins 115, and the heating device 117 described above with reference to FIG. 1A, respectively.

Inner vacuum ports 2111 and outer vacuum ports 2110 may be formed on the heating plate 210. Each of the inner vacuum ports 2111 and the outer vacuum ports 2110 may be arranged in circular symmetry with respect to the center of the top surface of the heating plate 210. FIG. 6 illustrates that the inner vacuum ports 2111 are formed at a middle region MR and the outer vacuum ports 2110 are formed at an edge region ER. However, embodiments are not limited thereto.

The first through third temperature controllers 121, 123, and 125 may generate first through third temperature control signals TCS1, TCS2, and TCS3 respectively, based on first through third temperature control commands TCC1, TCC2, and TCC3, according to a process recipe. The first temperature control signal TCS1 may be a signal for controlling a power output of the first power supply 131 corresponding to a central region CR of the heating plate 210. The second temperature control signal TCS2 may be a signal for controlling a power output of the second power supply 133 corresponding to the edge region ER of the heating plate 210. The third temperature control signal TCS3 may be a signal for controlling a power output of the third power supply 135 corresponding to the middle region MR of the heating plate 210.

The first through third power supplies 131, 133, and 135 may respectively provide operational power to portions of the heating device 217, the portions corresponding to the central region CR, the edge region ER, and the middle region MR of the heating plate 210, in response to the first through third temperature control signals TCS1, TCS2, and TCS3.

The plurality of temperature sensors 213 may measure first through third temperatures T1, T2, and T3, which are temperatures of the central region CR, the edge region ER, and the middle region MR of the heating plate 210, respectively.

The first through third temperature controllers 121, 123, and 125 may read signals about the first through third temperatures T1, T2, and T3, respectively, and generate first through third feedback temperature control signals FTCS1, FTCS2, and FTCS3, based on the read signals. Because the first through third power supplies 131, 133, and 135 supply power outputs to the heating device 217, according to the first through third feedback temperature control signals FTCS1, FTCS2, and FTCS3, uniform temperature distribution may be realized on the entire surface of the heating plate 210. Thus, uniform processing of the wafer W is feasible.

The wafer chucking controller 140 may generate first and second pressure control signals PCS1 and PCS2 based on a wafer chucking command WCC. The first electronic pressure regulator 151 may regulate vacuum pressure of the inner vacuum ports 2111 based on the first pressure control signal PCS1. The second electronic pressure regulator 153 may regulate vacuum pressure of the outer vacuum ports 2110 based on the second pressure control signal PCS2. Depending on cases, the pressure of the outer vacuum ports 2110 and the pressure of the inner vacuum ports 2111 may be different from each other.

The wafer chucking controller 140 may generate first and second feedback pressure control signals FPCS1 and FPCS2 based on the first through third feedback temperature control signals FTCS1, FTCS2, and FTCS3. The wafer chucking controller 140 may determine whether or not warpage occurs to the wafer W based on the first through third feedback temperature control signals FTCS1, FTCS2, and FTCS3. The wafer chucking controller 140 may determine a vertical distance from a certain location on the wafer W to the heating plate 210 based on the first through third feedback temperature control signals FTCS1, FTCS2, and FTCS3. In some embodiments, the wafer chucking controller 140 may determine a three-dimensional shape of the wafer W and generate the first and second feedback pressure signals FPCS1 and FPCS2 for chucking the wafer W via optimum vacuum pressure, based on the three-dimensional shape of the wafer W. The first and second electronic pressure regulators 151 and 153 may regulate the pressure of the inner vacuum ports 2111 and the pressure of the outer vacuum ports 2110, respectively, based on the first and the second feedback pressure signals FPCS1 and FPCS2, respectively.

FIGS. 5 and 6 illustrate that two electronic pressure regulators are provided to regulate the pressure of the inner vacuum ports 2111 and pressure of the outer vacuum ports 2110, respectively. However, embodiments are not limited thereto. For example, each vacuum port may be connected to a different electronic pressure regulator and a different pressure may be applied to each vacuum port. Furthermore, additional vacuum ports may be provided at the central region CR, in addition to the edge region ER and the middle region MR.

Figure 7:
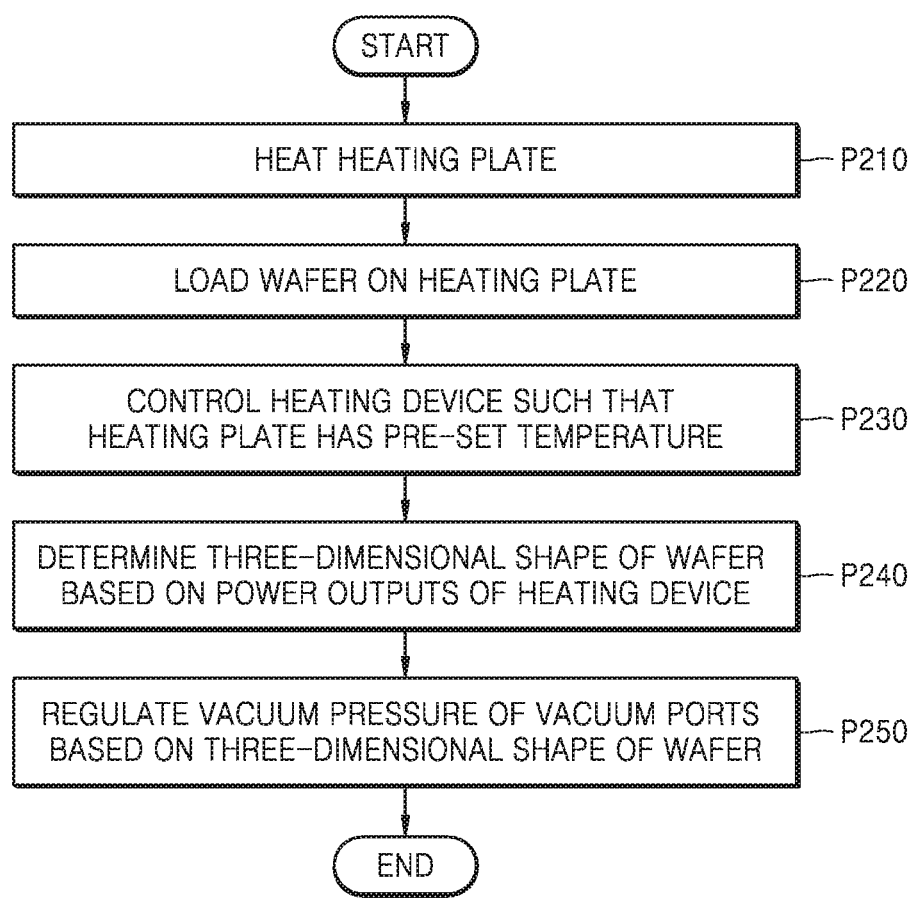
FIG. 7 is a flowchart of a wafer processing method according to embodiments.

FIG. 7 is a flowchart of a wafer processing method according to embodiments.

For convenience of description, aspects that are the same as the aspects described with reference to FIG. 3 will not be repeated.

Operations P210 and P220 of FIG. 7 are substantially the same as operations P110 and P120 of FIG. 3, respectively.

Referring to FIGS. 5 through 7, in operation P230, the heating device 217 may be controlled such that the heating plate 210 has a pre-set temperature.

Operation P230 may be performed substantially simultaneously with the loading of the wafer W in operation P220, or right after the loading of the wafer W in operation P220.

The controlling of the heating device 218 may be similar to what is described above. In more detail, the controlling of the heating device 217 may include: measuring the temperature of the heating plate 210 for each region, the temperature including the first through third temperatures T1 through T3; generating the first through third feedback temperature control signals FTCS1 through FTCS3 based on the temperature for each region; and providing power outputs to the portions of the heating device 217, the portions corresponding to the different regions of the heating plate 210, based on the first through third feedback temperature control signals FTCS1 through FTCS3.

Next, referring to FIGS. 1A and 3, vacuum pressure for chucking the wafer W may be regulated based on the power outputs of the heating device 217, in operation P240.

In some embodiments, the wafer chucking controller 140 may compare the power outputs of the heating device 217 corresponding to the central region CR, the edge region ER, and the middle region MR of the heating plate 210, respectively, with reference values. The reference values may be power outputs of the heating device 217 corresponding to the central region CR, the edge region ER, and the middle region MR of the heating plate 210, respectively, right after the wafer W having no warpage is loaded onto the heating plate 210.

In some embodiments, the wafer chucking controller 140 may calculate distances from certain locations on the wafer W to the heating plate 210, based on differences between the power outputs of the heating device 217 corresponding to the central region CR, the edge region ER, and the middle region MR of the heating plate 210, respectively, and the reference values. In some embodiments, the wafer chucking controller 140 may determine a three-dimensional shape of the wafer W based on the calculated distances.

In other embodiments, the wafer chucking controller 140 may determine the three-dimensional shape of the wafer W by using a look-up function about data about the differences between the reference values and the power outputs of the heating device 217 corresponding to the central region CR, the edge region ER, and the middle region MR of the heating plate 210, respectively, or by comparison, etc., between previous online/offline data.

The wafer chucking controller 140 may generate the first and second feedback pressure control signals FPCS1 and FPCS2 based on the three-dimensional shape of the wafer W. The first and second electronic pressure regulators 151 and 153 may output vacuum pressure for minimizing warpage of the wafer W, based on the first and second feedback pressure control signals FPCS1 and FPCS2.

According to example embodiments, even when the wafer W to be processed has warpage of an irregular shape, the first and second electronic pressure regulators 151 and 153 may perform the controlling operation of minimizing the warpage. Thus, the reliability with respect to uniform processing of the wafer W may be increased.

Figure 8A:
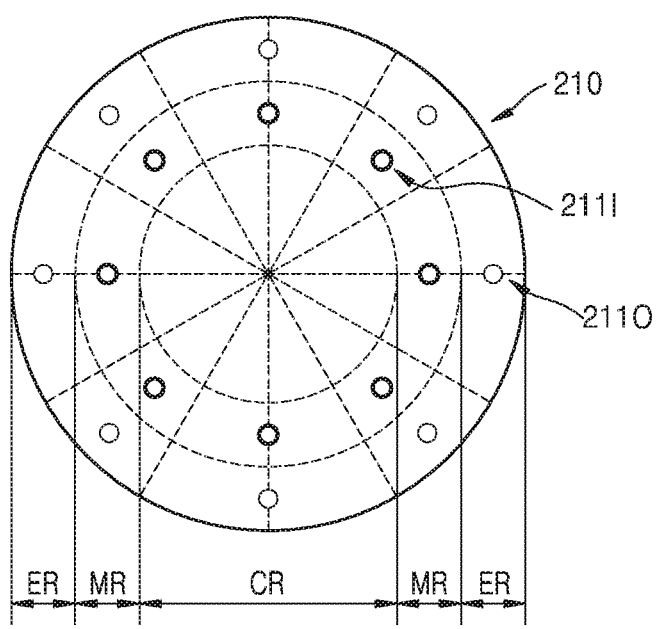
FIGS. 8A and 8B are plan views showing a top surface of a heating plate for describing chucking of a wafer, according to embodiments.
Figure 8B:
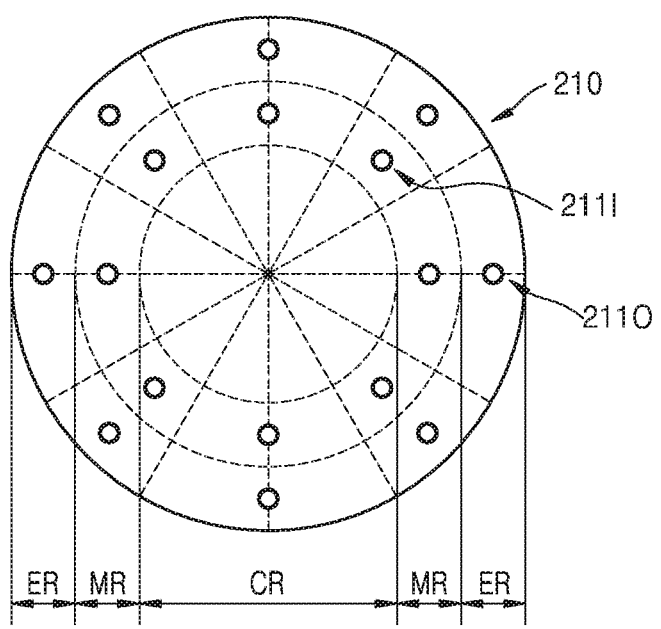

FIGS. 8A and 8B are plan views of a top surface of the heating plate 110 for describing chucking of the wafer W, according to embodiments.

The inner vacuum ports 2111 and the outer vacuum ports 2110 indicated by using relatively thick lines from among the inner vacuum ports 2111 and the outer vacuum ports 2110 in FIGS. 8A and 8B indicate that the controlling operations are performed thereon based on the feedback pressure control signals FPCS1 and FPCS2. Also, the inner vacuum ports 2111 and the outer vacuum ports 2110 indicated by using relatively thin lines from among the inner vacuum ports 2111 and the outer vacuum ports 2110 indicate that the controlling operations are performed thereon based on the feedback pressure control signals FPCS1 and FPCS2.

The controlling operation of the first and second electronic pressure regulators 151 and 153 based on the first and second feedback pressure control signals FPCS1 and FPCS2 may be sequentially performed. For example, as illustrated in FIG. 8A, after the inner vacuum ports 2111 are controlled based on the first feedback pressure control signals FPCS1 to receive optimum vacuum pressure, as illustrated in FIG. 8B, the outer vacuum ports 2110 may be controlled based on the second feedback pressure control signals FPCS2 to receive optimum vacuum pressure.

However, embodiments are not limited thereto. The optimization operations based on the first and second feedback pressure control signals FPCS1 and FPCS2 may be substantially simultaneously performed on the inner vacuum ports 2111 and the outer vacuum ports 2110, or may be first performed on the outer vacuum ports 2110 and then on the inner vacuum ports 2111.

Figure 9:
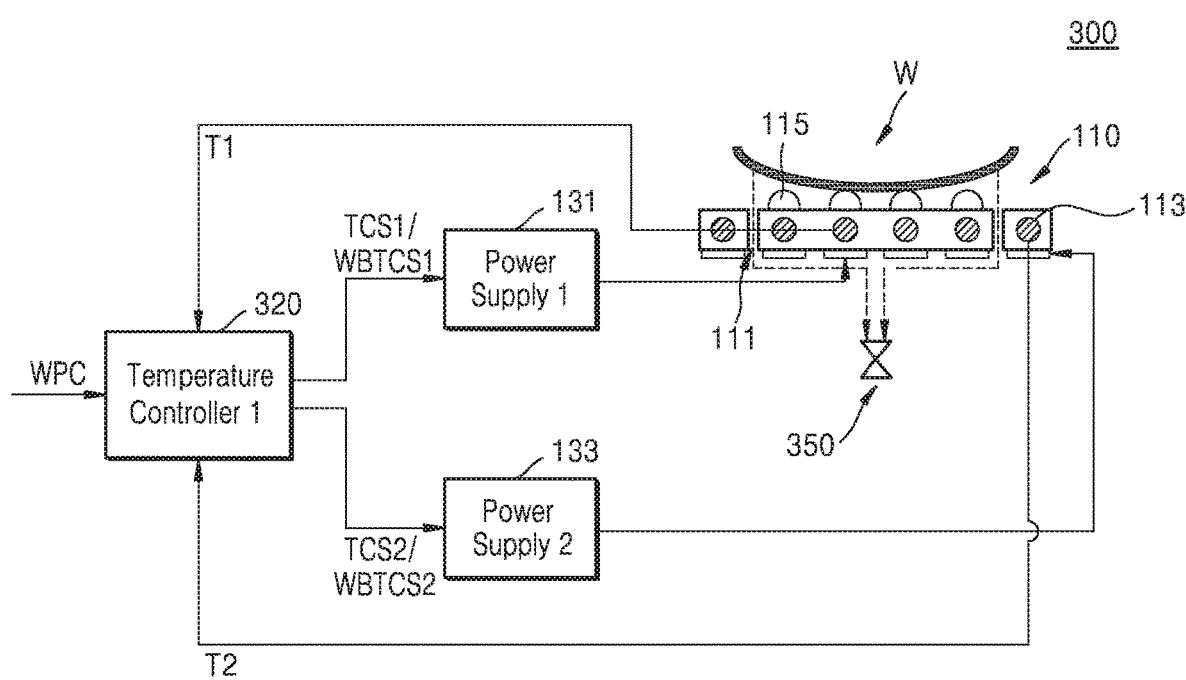
FIG. 9 is a diagram for describing a wafer processing apparatus according to embodiments.

FIG. 9 is a diagram for describing a wafer processing apparatus 300 according to embodiments.

For convenience of description, aspects that are the same as the aspects described with reference to FIG. 1A will not be repeated.

Referring to FIG. 9, the wafer processing apparatus 300 may include the heating plate 110, the vacuum ports 111, the support pins 115, the heating device 117, a temperature controller 320, the first and second power supplies 131 and 133, and a pressure valve 350.

The heating plate 110, the vacuum ports 111, the support pins 115, the heating device 117, and the first and second power supplies 131 and 133 are substantially the same as the components described with reference to FIG. 1A.

The pressure valve 350 may be connected to an external device, such as a vacuum pump, and vacuum pressure generated by the vacuum pump may be provided to the vacuum ports 111 through the pressure valve 350. The pressure valve 350 may supply substantially constant pressure to the vacuum ports 111, unlike the electronic pressure regulator 160 in FIG. 1A.

The temperature controller 320 may generate first and second temperature control signals TCS1 and TCS2 for controlling the first and second power supplies 131 and 133, respectively, based on a wafer processing command WPC according to process recipe.

The temperature controller 320 may determine whether or not the wafer W has warpage and the degree of the warpage, by using the same method as the method described with reference to FIGS. 1A, 1B, 1C, 2A, 2B, 2C, 3 and 4. In more detail, a wafer warpage controller 340 may generate a first warpage-based temperature control signal WBTCS1 and a second warpage-based temperature control signal WBTCS2, based on the degree of the warpage of the wafer W.

According to the related art, when a temperature drop of the heating plate 110 due to the loading of the wafer W is less, the temperature controller 320 may generate signals for controlling the first and second power supplies 131 and 133 to output relatively low power outputs.

According to embodiments, the temperature controller 320 may determine the warpage of the wafer W based on the first and second temperatures T1 and T2 of the heating plate 110. The temperature controller 320 may generate the first and second warpage-based temperature control signals WBTCS1 and WBTCS2 for substantially uniformly heating the entire surface of the wafer W.

In more detail, when a drop of the first temperature T1, which is the temperature of the central region CR (see FIG. 2A) of the heating plate 110, is greater than a drop of the second temperature T2, which is the temperature of the edge region ER (see FIG. 2A) of the heating plate 110, the temperature controller 320 may determine that the wafer W has warpage of a downwardly convex shape.

Accordingly, the wafer W may generate the first and second warpage-based temperature control signals WBTCS1 and WBTCS2 for allowing the power output transmitted to a portion of the heating device 117, the portion corresponding to the edge region ER (see FIG. 2A) of the heating plate 110, to be greater than the power output transmitted to a portion of the heating device 117, the portion corresponding to the central region CR (see FIG. 2A) of the heating plate 110. Accordingly, even when the warpage occurs to the wafer W, the temperature of the entire surface of the wafer W may be uniformly controlled, and thus, uniform processing of the wafer W may be feasible.

Figure 10:
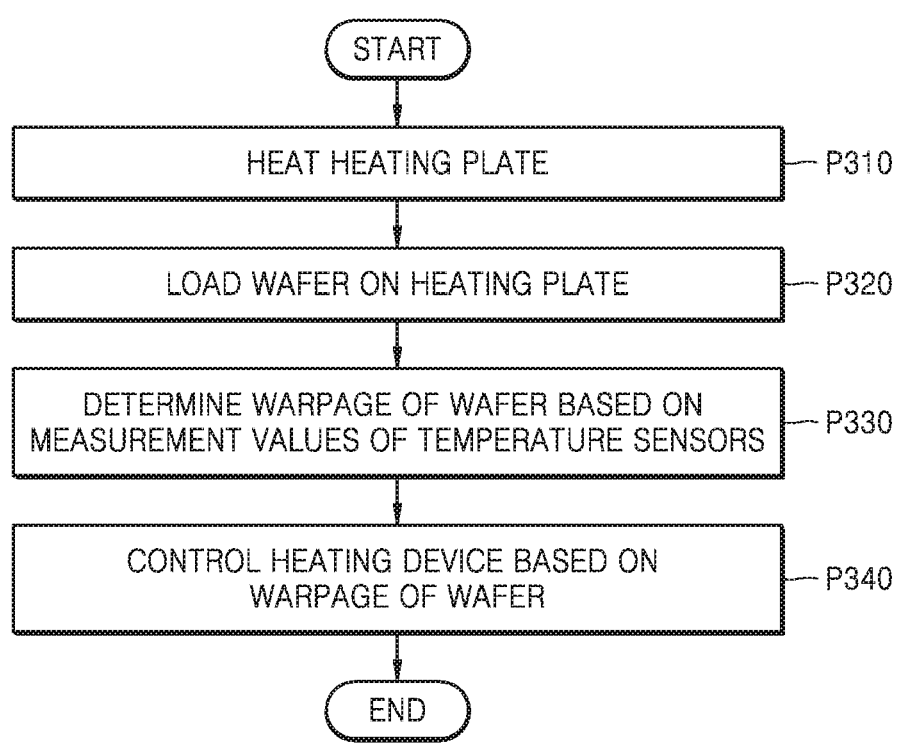
FIG. 10 is a flowchart of a wafer processing method according to embodiments.

FIG. 10 is a flowchart of a wafer processing method according to embodiments.

Operations P310 and P320 of FIG. 10 are substantially the same as operations P110 and P120 of FIG. 3.

Referring to FIGS. 9 and 10, warpage of the wafer W may be determined based on measurement values of the temperature sensors 113, in operation P330.

The temperature controller 320 may determine the warpage of the wafer W based on data about a previous feedback temperature control signal according to the first and second temperatures T1 and T2 of the heating plate 110.

Next, in operation P340, the heating device 117 may be controlled based on the warpage of the wafer W.

The controlling of the heating device 117 may include generating, via the temperature controller 320, the first and second warpage-based temperature control signals WBTCS1 and WBTCS2, and supplying, via the first and second power supplies 131 and 133, power outputs generated based on the first and second warpage-based temperature control signals WBTCS1 and WBTCS2 to the heating device 117. As described above, the heating device 117 may be controlled to output relatively more heat for a portion of the heating plate 110, the portion relatively farther apart from the wafer W.

Figure 11:
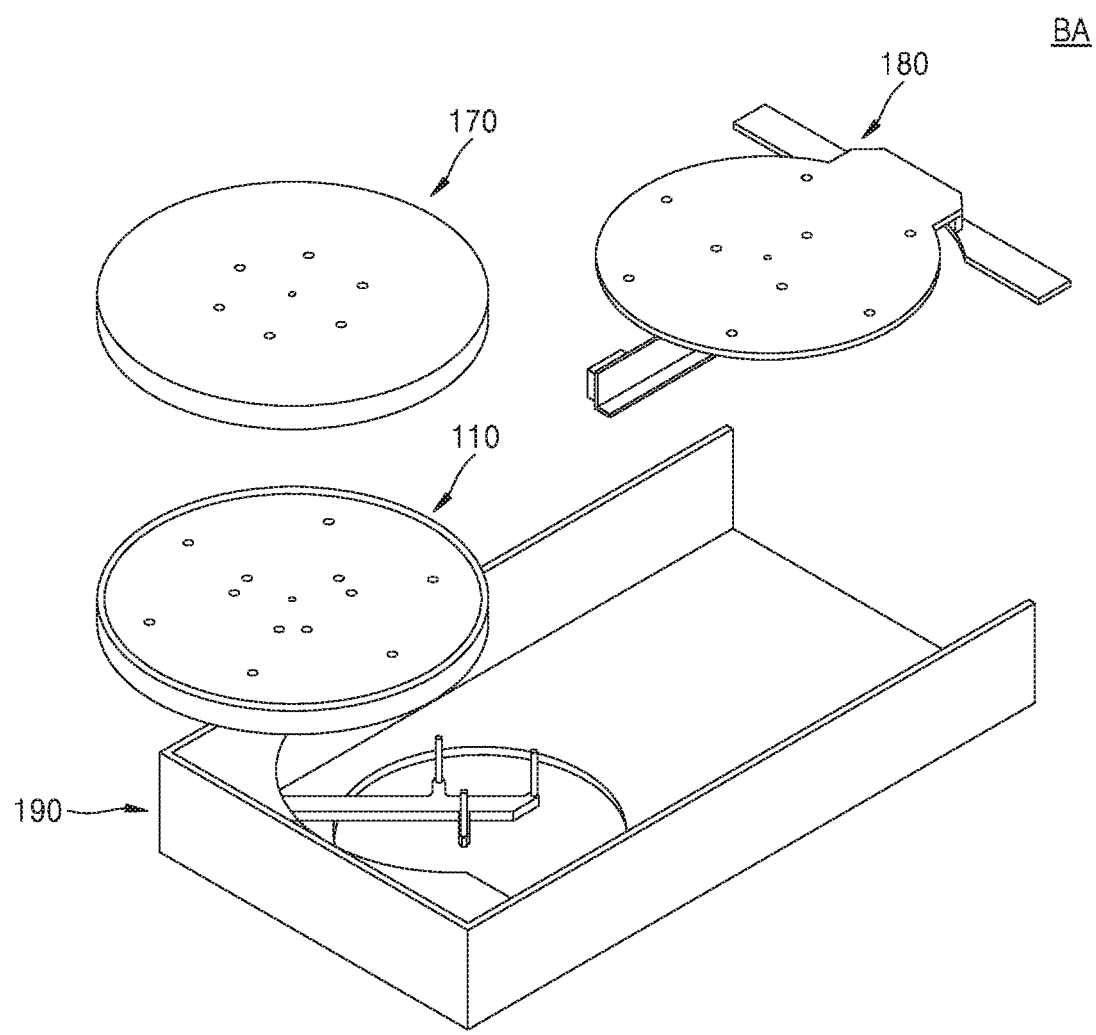
FIG. 11 is a schematic perspective view for describing a bake apparatus according to embodiments.

FIG. 11 is an exploded perspective view schematically showing main components of a bake apparatus BA according to example embodiments.

Referring to FIG. 11, the bake apparatus BA may further include a chamber 170, a transporting robot 180, and a base module 190, in addition to the components included in the wafer processing apparatus 100a of FIG. 1A.

However, embodiments are not limited thereto. The bake apparatus BA may further include the chamber 170, the transporting robot 180, and the base module 190, in addition to the components included in the wafer processing apparatuses 100b, 100c, 200, and 300 of FIGS. 1B, 1C, 5, and 9.

The transporting robot 180 may introduce a wafer into the bake apparatus BA or withdraw the wafer fully processed from the bake apparatus BA.

The chamber 170 may include an exhaust structure for exhausting gas generated during heating of the wafer. The chamber 170 may isolate the wafer from the outside while a processing operation is performed. The chamber 170 may prevent the heat for processing the wafer from being discharged to the outside of the chamber 170 and prevent the wafer from being contaminated by particles outside the chamber 170. The chamber 170 may cover both of the heating plate 110 and the wafer, or may cover only the wafer.

The base module 190 may support various components included in the bake apparatus BA, such as the heating plate 110, the chamber 170, etc.

When the wafer is transported by the transporting robot 180, the chamber 170 may be opened, the wafer may be loaded on the heating plate by the transporting robot 180, and the chamber 170 may be closed. Next, when the wafer is sufficiently heated, the chamber 170 may be opened again and the wafer may be carried out by the transporting robot 180.

Figure 12:
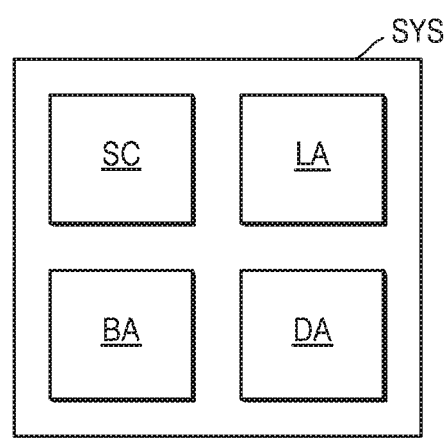
FIG. 12 is a block diagram of a system including a bake apparatus according to embodiments.

FIG. 12 is a block diagram of a system SYS including the bake apparatus BA, according to embodiments.

Referring to FIG. 12, the system SYS may include a spin coater SC, a lithography apparatus LA, the bake apparatus BA, and a developing device DA.

Processes performed by the system SYS may include manufacturing a semiconductor wafer or a semiconductor structure including a wafer including a circuit structure. The processes performed by the system SYS may include, for example, a semiconductor process based on deep ultra-violet (DUV) or extreme UV (EUV).

The spin coater SC may provide a photoresist layer on a semiconductor structure SS by using a spin coating method.

The bake apparatus BA may be the bake apparatus BA described with reference to FIG. 12. In some embodiments, the bake apparatus BA may perform a soft bake process after the photoresist layer is coated on the wafer by the spin coater SC. In some embodiments, the bake apparatus BA may further perform a post exposure bake (POB) process after an exposure process by the lithography apparatus LA, and a hard bake process after a developing process by the developing device DA.

The lithography apparatus LA may perform an EUV lithography process. The lithography apparatus LA may include a measuring station and an exposure station.

The lithography apparatus LA may be a dual stage-type apparatus including two wafer tables. The wafer tables may respectively be an exposure station for exposure and a measuring station for measurement. Accordingly, while the semiconductor structure SS on one wafer table is exposed, the semiconductor structure SS on the other wafer table may be measured before being exposed. Because measuring alignment marks requires much time and the lithography process is a bottleneck process of the overall semiconductor process, when two wafer tables are provided, productivity of the semiconductor devices may be significantly increased. However, embodiments are not limited thereto. The lithography apparatus LA may include a mono stage-type lithography apparatus including a single wafer table.

The developing apparatus DA may form photoresist patterns by developing an exposed photoresist layer.

The system SYS may further include an inspection apparatus for inspection after exposure, according to necessity.

The inspection apparatus may include a scatterometer, such as an angle-resolved scatterometer or a spectroscopic scatterometer.

The system SYS may further include, for example, an etching apparatus. The etching apparatus may etch the wafer by using the developed photoresist layer as an etch mask. According to other embodiments, the system SYS may further include apparatuses for performing an ion implant process, a deposition process, etc.

While embodiments been particularly shown and described with reference to embodiments thereof, it will be understood that various changes in form and details may be made therein without departing from the spirit and scope of the following claims.

What is claimed is:

1. A wafer processing apparatus comprising:
 a heating plate through which a plurality of vacuum ports is formed, and a central region and an edge region surrounding the central region are defined;
 a plurality of temperature sensors equipped in the heating plate;
 a heater configured to heat the heating plate;
 a first power supply and a second power supply configured to provide operational power to different portions of the heater;
 a first temperature controller configured to generate a first feedback temperature control signal for controlling power output of the first power supply based on a first measurement value generated by the plurality of temperature sensors;
 a second temperature controller configured to generate a second feedback temperature control signal for controlling power output of the second power supply based on a second measurement value generated by the plurality of temperature sensors;
 an electronic pressure regulator configured to provide vacuum pressure for fixing a wafer disposed on the heating plate to the plurality of vacuum ports and regulate pressure of the plurality of vacuum ports; and
 a wafer chucking controller configured to control the electronic pressure regulator, and generate a feedback pressure control signal for controlling the pressure of the electronic pressure regulator based on the first feedback temperature control signal and the second feedback temperature control signal.

2. The wafer processing apparatus of claim 1, wherein the wafer chucking controller is further configured to identify a power difference between the first power supply and the second power supply based on the first feedback temperature control signal and the second feedback temperature control signal.

3. The wafer processing apparatus of claim 1, wherein the plurality of temperature sensors comprises first temperature sensors corresponding to the central region and second temperature sensors corresponding to the edge region,
 wherein the first temperature sensors are configured to generate the first measurement value and the second temperature sensors are configured to generate the second measurement value,
 wherein the first temperature controller is further configured to generate the first feedback temperature control signal based on the first measurement value, and
 wherein the second temperature controller is further configured to generate the second feedback temperature control signal based on the second measurement value.

4. The wafer processing apparatus of claim 1, wherein the wafer chucking controller is further configured to determine whether or not warpage of the wafer occurs based on the first feedback temperature control signal and the second feedback temperature control signal, directly after the wafer is loaded.

5. The wafer processing apparatus of claim 1, wherein the wafer chucking controller is further configured to identify a difference between a first power output of the first power supply and a second power output of the second power supply, directly after the wafer is loaded.

6. The wafer processing apparatus of claim 5, wherein the wafer chucking controller is further configured to identify a ratio of the difference to a reference value, directly after the wafer is loaded.

7. The wafer processing apparatus of claim 6, wherein the reference value corresponds to a difference between the first power output of the first power supply and the second power output of the second power supply, directly after a flat wafer is loaded.

8. The wafer processing apparatus of claim 1, wherein the wafer chucking controller is further configured to identify a degree of warpage of the wafer based on the first feedback temperature control signal and the second feedback temperature control signal, directly after the wafer is loaded.

9. The wafer processing apparatus of claim 8, wherein the wafer chucking controller is further configured to generate the feedback pressure control signal based on the degree of warpage of the wafer.

10. The wafer processing apparatus of claim 1, wherein the first power supply is configured to provide first power to a central portion of the heater corresponding to the central region, and
 wherein the second power supply is configured to provide second power to an edge portion of the heater corresponding to the edge region.

11. A wafer processing apparatus comprising:
 a heating plate through which a plurality of vacuum ports is formed, and a central region, an edge region surrounding the central region, and a middle region between the central region and the edge region are defined;
 a plurality of temperature sensors configured to measure a temperature of the heating plate;
 a heater configured to heat the heating plate;
 a first power supply, a second power supply and a third power supply configured to provide operational power to the heater;
 a first temperature controller configured to generate a first feedback temperature control signal for controlling a first power output of the first power supply based on a first measurement value of the plurality of temperature sensors;
 a second temperature controller configured to generate a second feedback temperature control signal for controlling a second power output of the second power supply based on a second measurement value of the plurality of temperature sensors;
 a third temperature controller configured to generate a third feedback temperature control signal for controlling a third power output of the third power supply based on a third measurement value of the plurality of temperature sensors;
 an electronic pressure regulator configured to regulate pressure of the plurality of vacuum ports; and
 a wafer chucking controller configured to control the electronic pressure regulator, wherein the plurality of vacuum ports comprises:
a plurality of first vacuum ports arranged in circular symmetry with respect to the center of the heating plate; and
a plurality of second vacuum ports arranged in circular symmetry with respect to the center of the heating plate and farther from the central region of the heating plate than the plurality of first vacuum ports,
wherein the electronic pressure regulator comprises:
a first electronic pressure regulator configured to regulate pressure of the plurality of first vacuum ports; and
a second electronic pressure regulator configured to regulate pressure of the plurality of second vacuum ports, and
wherein the wafer chucking controller is further configured to generate a first feedback pressure control signal and a second feedback pressure control signal configured to control, respectively, pressure of the first electronic pressure regulator and the second electronic pressure regulator based on the first feedback temperature control signal, the second feedback temperature control signal and the third feedback temperature control signal.

12. The wafer processing apparatus of claim 11, wherein the plurality of temperature sensors comprises first temperature sensors corresponding to the central region, second temperature sensors corresponding to the edge region, and third temperature sensors corresponding to the middle region,
wherein the first temperature sensors are configured to generate the first measurement value, the second temperature sensors are configured to generate the second measurement value and the third temperature sensors are configured to generate the third measurement value,
wherein the first temperature controller is further configured to generate the first feedback temperature control signal based on the first measurement value,
wherein the second temperature controller is further configured to generate the second feedback temperature control signal based on the second measurement value, and
wherein the third temperature controller is further configured to generate the third feedback temperature control signal based on the third measurement value.

13. The wafer processing apparatus of claim 12, wherein the first power supply is configured to provide operational power to a central portion of the heater corresponding to the central region, based on the first feedback temperature control signal,
wherein the second power supply is configured to provide operational power to an edge portion of the heater corresponding to the edge region, based on the second feedback temperature control signal, and
wherein the third power supply is configured to provide operational power to a middle portion of the heater corresponding to the middle region, based on the third feedback temperature control signal.

14. The wafer processing apparatus of claim 11, wherein the wafer chucking controller is further configured to identify a distance between the heating plate and a certain location of a wafer disposed on the heating plate based on the first feedback temperature control signal, the second feedback temperature control signal and the third feedback temperature control signal.

15. The wafer processing apparatus of claim 11, wherein the wafer chucking controller is further configured to identify a three-dimensional shape of the wafer based on the first feedback temperature control signal, the second feedback temperature control signal and the third feedback temperature control signal.

16. The wafer processing apparatus of claim 15, wherein the wafer chucking controller is further configured to generate the first feedback pressure control signal and the second feedback pressure control signal corresponding to the first electronic pressure regulator and the second electronic pressure regulator, respectively, based on the three-dimensional shape.

17. A wafer processing apparatus comprising:
a heating plate through which a plurality of vacuum ports is formed, and a central region and an edge region surrounding the central region are defined;
a plurality of temperature sensors configured to measure a temperature of the heating plate;
a heater configured to heat the heating plate;
a first power supply and a second power supply configured to provide operational power to the heater;
a first meter and a second meter configured to measure a first power output of the first power supply and a second power output of the second power supply, respectively;
a first temperature controller and a second temperature controller configured to generate a first feedback temperature control signal and a second feedback temperature control signal configured to control the first power output and the second power output based on measurement values of the plurality of temperature sensors;
an electronic pressure regulator configured to regulate pressure of the plurality of vacuum ports; and
a wafer chucking controller configured to control pressure of the electronic pressure regulator, and generate a feedback pressure control signal for controlling the pressure of the electronic pressure regulator based on the first power output and the second power output.

18. The wafer processing apparatus of claim 17, wherein the wafer chucking controller is further configured to identify a degree of warpage of the wafer based on the first power output measured by the first meter and the second power output measured by the second meter, and control the electronic pressure regulator based on the degree of warpage.

19. The wafer processing apparatus of claim 18, wherein the wafer chucking controller is further configured to generate the feedback pressure control signal based on the degree of warpage of the wafer.

20. The wafer processing apparatus of claim 18, wherein the first power supply is further configured to provide operational power to a central portion of the heater corresponding to the central region, based on the first feedback temperature control signal, and
wherein the second power supply is further configured to provide operational power to an edge portion of the heater corresponding to the edge region, based on the second feedback temperature control signal.

* * * * *